(12) United States Patent
Wong et al.

(10) Patent No.: US 11,144,104 B2
(45) Date of Patent: Oct. 12, 2021

(54) MODE SELECTION CIRCUIT FOR LOW-COST INTEGRATED CIRCUITS SUCH AS MICROCONTROLLERS

(71) Applicant: Silicon Laboratories Inc., Austin, TX (US)

(72) Inventors: Rex Tak Ying Wong, Singapore (SG); Michael R. May, Austin, TX (US); Pio Balmelli, Arogno (CH)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 16/791,210

(22) Filed: Feb. 14, 2020

(65) Prior Publication Data

US 2021/0255678 A1 Aug. 19, 2021

(51) Int. Cl.
*G06F 1/26* (2006.01)
*G06F 13/40* (2006.01)
*G01R 19/165* (2006.01)
*G06F 11/22* (2006.01)

(52) U.S. Cl.
CPC ......... *G06F 1/26* (2013.01); *G01R 19/16538* (2013.01); *G06F 13/4027* (2013.01); *G06F 11/2273* (2013.01)

(58) Field of Classification Search
CPC ...... G06F 1/26; G06F 3/0634; G06F 11/2273; G06F 11/2236; G06F 11/267; G06F 11/2733; G06F 13/4027; G06F 13/42; G01R 19/165; G01R 19/16538; G11C 7/10; G11C 7/1048; G11C 7/1078; G11C 7/109

See application file for complete search history.

(56) References Cited

U.S. PATENT DOCUMENTS

| 5,402,063 | A | * | 3/1995 | Kim | G01R 31/31701 324/750.3 |
| 5,408,435 | A | * | 4/1995 | McClure | G11C 29/46 365/201 |
| 5,440,178 | A | * | 8/1995 | McClure | H03K 5/1252 327/31 |

(Continued)

OTHER PUBLICATIONS

Hu, Chenming. "Modern Semiconductor Devices for Integrated Circuits". Chapters. Pearson/Prentice Hall, New Jersey. 2010. pp. 157-193. (Year: 2010).*

(Continued)

*Primary Examiner* — Thomas J. Cleary
(74) *Attorney, Agent, or Firm* — Polansky & Associates, P.L.L.C.; Paul J. Polansky (57) ABSTRACT

In one form, an integrated circuit includes a negative voltage detector circuit and a logic circuit. The negative voltage detector circuit has a power supply input coupled to a power supply voltage terminal, a ground input coupled to a ground voltage terminal, a first input coupled to a first signal terminal, a second input coupled to a second signal terminal, and an output for providing an enable signal when a voltage on the first signal terminal is less than a voltage on the ground voltage terminal by at least a predetermined amount when a signal on said second signal terminal is in a first predetermined logic state. The logic circuit has an input for receiving the enable signal. The logic circuit changes an operation of the integrated circuit in response to an activation of the enable signal.

22 Claims, 4 Drawing Sheets

(56) References Cited

U.S. PATENT DOCUMENTS

| | | | | |
|---|---|---|---|---|
| 5,734,661 | A * | 3/1998 | Roberts | G06F 11/2733 |
| | | | | 714/733 |
| 6,087,841 | A * | 7/2000 | Bonaccio | G01R 31/68 |
| | | | | 324/754.03 |
| 2002/0027795 | A1* | 3/2002 | Endo | G11C 29/50 |
| | | | | 365/120 |
| 2006/0279308 | A1* | 12/2006 | Ong | G11C 29/48 |
| | | | | 324/750.3 |
| 2008/0177916 | A1* | 7/2008 | Cagno | G06F 13/4295 |
| | | | | 710/110 |
| 2011/0122671 | A1* | 5/2011 | May | G11C 17/146 |
| | | | | 365/94 |
| 2014/0269140 | A1* | 9/2014 | Sanjeevarao | G11C 8/08 |
| | | | | 365/230.06 |
| 2018/0083788 | A1* | 3/2018 | Yano | H04L 9/3226 |

OTHER PUBLICATIONS

"EFM32HG108, F64/F32, Preliminary"; data sheet; Rev. 0.91; May 6, 2015; Silicon Laboratories Inc.; 400 West Cesar Chavez, Austin, TX 78701; 53 pages.

"AN0002.2: EFR32 Wireless Gecko Series 2 Hardware Design Considerations"; Rev. 0.2; Dec. 2019; Silicon Laboratories Inc.; 400 West Cesar Chavez, Austin, TX 78701; 16 pages.

* cited by examiner

MODE SELECTION CIRCUIT FOR LOW-COST INTEGRATED CIRCUITS SUCH AS MICROCONTROLLERS

FIELD

The present disclosure relates generally to integrated circuits, and more particularly to low-cost integrated circuits such as microcontrollers (MCUs) that provide user-selectable modes.

BACKGROUND

Microcontrollers (MCUs) are integrated circuits that combine the main components of a computer system, i.e. a central processing unit (CPU), memory, and input/output (I/O) peripheral circuits, on a single integrated circuit chip. Modern MCUs are useful in a wide variety of consumer products such as mobile phones, household appliances, automotive components, and the like because of their low-cost. Some factors that contribute to MCU cost include silicon die area, the number of input and/or output terminals, the manufacturing process technology used, and the like. There is a trade-off between the range of features available on the MCU and its product cost, limiting the range of applications in which a given MCU can be used.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, an integrated circuit includes a negative voltage detector circuit and a logic circuit. The negative voltage detector circuit has a power supply input coupled to a power supply voltage terminal, a ground input coupled to a ground voltage terminal, a first input coupled to a first signal terminal, a second input coupled to a second signal terminal and an output for providing an enable signal when a voltage on the first signal terminal is less than a voltage on the ground voltage terminal by at least a predetermined amount when a signal on the second signal terminal is in a first predetermined logic state. The logic circuit has an input for receiving the enable signal. The logic circuit changes an operation of the integrated circuit in response to an activation of the enable signal.

In another form, an integrated circuit includes a negative voltage detector circuit, a first circuit, and a second circuit. The negative voltage detector circuit has a power supply input coupled to a power supply voltage terminal, a ground input coupled to a ground voltage terminal, a first input coupled to a first signal terminal, a first output for providing a first below-ground logic signal in an active state of a first voltage domain when a voltage on the first signal terminal is less than a voltage on the ground voltage terminal by at least a predetermined amount, and a second output for providing a second below-ground logic signal in an active state of a second voltage domain when a voltage on the first signal terminal is less than the voltage on the ground voltage terminal by at least the predetermined amount. The first circuit operates in the first voltage domain and has an input for receiving the first below-ground logic signal, and changes an operation thereof in response to an activation of the first below-ground logic signal. The second circuit operates in the first voltage domain and has an input for receiving the second below-ground logic signal, the second circuit changing an operation thereof in response to an activation of the second below-ground logic signal In yet another form, a circuit includes a below-ground detector circuit, a first output circuit, and an enable circuit. The below-ground detector circuit has an input coupled to a first signal terminal, and an output for providing an output voltage in a first logic state when a voltage on the first signal terminal is less than a voltage on the ground voltage terminal by at least a predetermined amount. The first output circuit provides a first below-ground logic signal in an active state of a first power domain in response to the output voltage being in the first logic state. The enable circuit is coupled to a second signal terminal and disables the first output circuit when the second signal terminal is in a second logic state.

In still another form, a method of operating an integrated circuit includes detecting whether a voltage on a first input/output port terminal of the integrated circuit is less than a voltage on a ground voltage terminal by at least a predetermined amount. The detecting is enabled in response to a logic state of a second input/output port terminal. The first below-ground logic signal of a first power domain is activated in response to detecting that the voltage on the first input/output port terminal of the integrated circuit is less than a voltage on the ground voltage terminal by at least a predetermined amount. An operation of a first circuit of the integrated circuit is changed in response to an activation the first below-ground logic signal.

Figure 1:
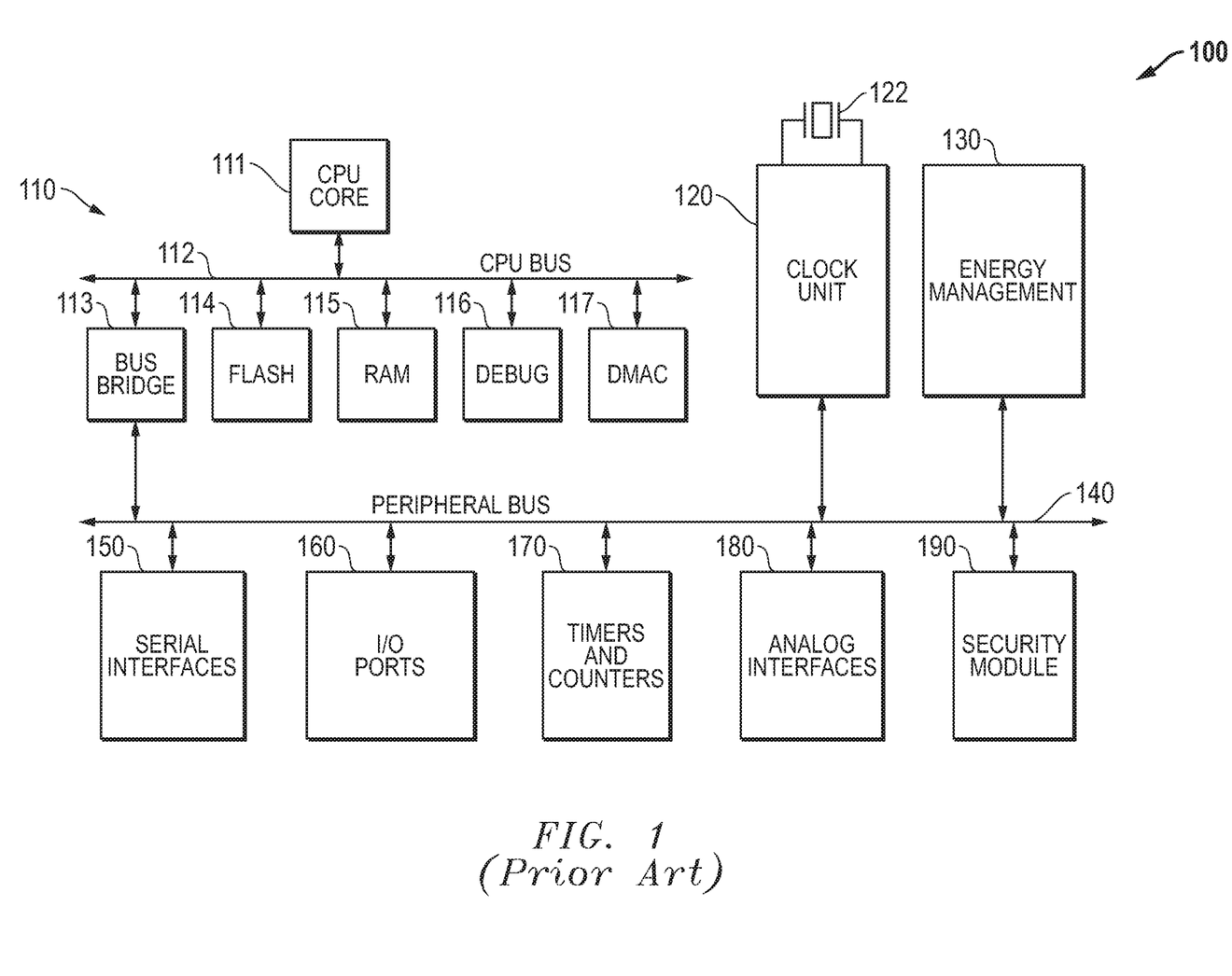
FIG. 1 illustrates in block diagram form an integrated circuit MCU known in the prior art.

FIG. 1 illustrates in block diagram form an integrated circuit MCU 100 known in the prior art. MCU 100 includes generally a CPU system 110, clock unit 120, an energy management circuit 130, a peripheral bus 140, a set of serial interfaces 150, a set of I/O ports 160, a set of timers and counters 170, a set of analog interfaces 180, and a security module 190.

CPU system 110 includes a CPU bus 112 interconnecting a CPU core 111, a bus bridge 113, a FLASH memory 114, a random-access memory (RAM) 115, a debug circuit 116, and a direct memory access controller (DMAC) 117. CPU system 110 includes a CPU bus 112 separate from peripheral bus 140 to isolate transactions initiated by CPU core 111 to local devices and memory without affecting traffic on peripheral bus 140. Bus bridge 113 is a circuit that allows cross-bus transfers between CPU bus 112 and peripheral bus 140. CPU system 110 provides FLASH memory 114 for non-volatile storage of program code that can be bootstrap loaded from an external source, as well as parameters that need to be preserved when MCU 100 is powered down. RAM 115 provides a working memory for use by CPU core 111. Debug circuit 116 provides program trace capabilities with access to registers on CPU core 111 for software debug.

DMAC 117 provides programmable direct memory access channels to offload CPU core 111 from routine data movement tasks between peripherals and memory.

MCU 100 includes a set of peripherals that make it suitable for a variety of general-purpose embedded applications. Peripheral bus 140 interconnects bus bridge 113, clock unit 120, energy management circuit 130, serial interfaces 150, I/O ports 160, timers and counters 170, analog interfaces 180, and security module 190. The serial interfaces in serial interfaces 150 operate according to a variety of synchronous and asynchronous character-oriented and serial protocols. I/O ports 160 are a set of general-purpose input/output circuits with terminals that can be programmed for specific functions or remain available to software for general purpose operation. Timers and counters 170 provide various programmable timing and event counting functions useful for embedded control, and include a watchdog timer and a real time clock. Analog interfaces 180 include an analog comparator and analog-to-digital converter (ADC) for accurate analog input signal measurement. Security module 190 provides an encryption function that is useful for data communication and storage in secure environments.

Generally, MCU 100 integrates CPU system 110 and several peripherals for a wide variety of application environments and is suitable for very low power operation. To facilitate low power operation, MCU 100 includes an energy management circuit 130 that provides several programmable functions to support extremely low power operation. For example, energy management circuit 130 can include a voltage regulator to provide a precise internal power supply voltage that is sufficient for the internal operating speed but low enough in voltage to reduce power consumption. It can also include a brown-out detector designed to force MCU 100 into reset when power consumption is too high, as well as a low-power power on reset circuit.

In addition, MCU 100 includes a clock unit 120 with a variety of clocks and clock functions that MCU 100 uses to support its low power modes. For example, clock unit 120 can include high frequency oscillators based on crystal references, as well as lower precision fully integrated resistor-capacitor (RC) oscillators and very low speed RC oscillators that allow standby and keep-alive operations. Shown in FIG. 1 is an external crystal resonator 122 that can be used with a crystal oscillator circuit in clock unit 120.

By integrating several common peripheral components on the same integrated circuit, MCU 100 provides a low-cost integrated circuit chip that can be used in a variety of low-cost applications. Additional features can be added but will generally incur the cost of extra silicon area and/or extra input/output terminals that contribute to overall system cost.

Figure 2:
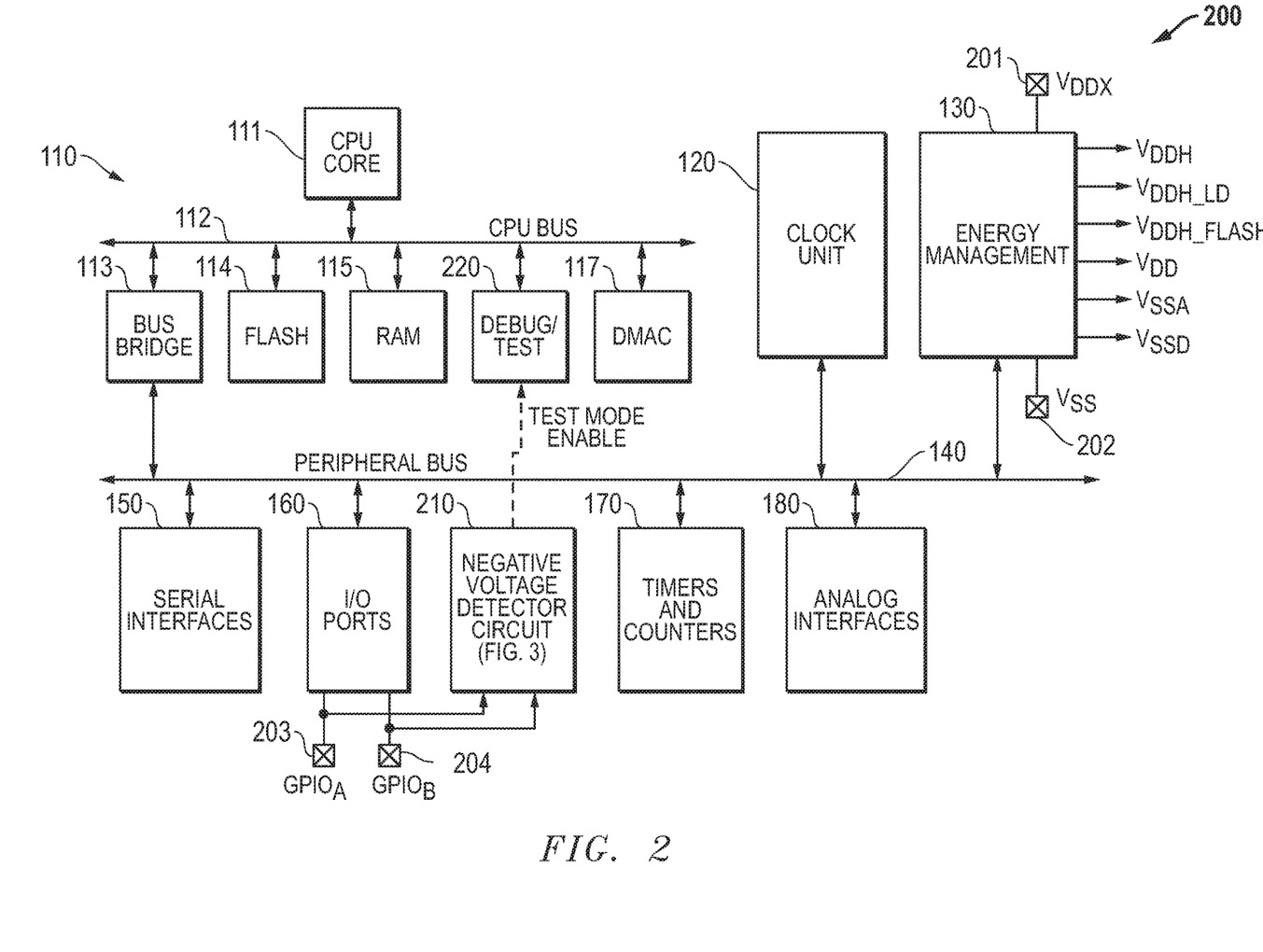
FIG. 2 illustrates in block diagram form an integrated circuit MCU with a negative voltage detector circuit according to an embodiment.

FIG. 2 illustrates in block diagram form an integrated circuit MCU 200 with a negative voltage detector circuit 210 according to an embodiment. MCU 200 is similar to MCU 100 of FIG. 1, except that MCU 200 includes negative voltage detector circuit 210 and a debug and test mode controller 220 instead of debug circuit 116 of MCU 100. To achieve very low cost, clock unit 120 does not use external crystal resonator 122, and MCU 200 does not use security module 190. Also shown in FIG. 2 is a set of integrated circuit terminals that includes a terminal 201 that conducts an external power supply voltage labeled "$V_{DDX}$", a terminal 202 that conducts a ground voltage labeled "$V_{SS}$", and general-purpose input/output terminals 203 and 204 labeled "$GPIO_A$" and "$GPIO_B$", respectively. As used herein, $V_{DDX}$, $V_{SSA}$, and other similar voltages refer to either the voltage itself or the node carrying the voltage, as the context dictates. I/O Ports 160 are connected to terminals 203 and 204 for conducting input and/or output signals according to a programmable terminal mapping defined using a control register, not shown in FIG. 2, for I/O Ports 160. Negative voltage detector circuit 210 has a first input connected to terminal 203, a second input connected to terminal 204, and an output for providing a signal labeled "TEST MODE ENABLE". Debug/test circuit 220 is bidirectionally connected to CPU bus 112 and has an input connected to the output of negative voltage detector circuit 210 for receiving the TEST MODE ENABLE signal.

FIG. 2 shows some details of the power supply system of MCU 200. Energy management circuit 130 has a first power supply terminal connected to terminal 201 for receiving external voltage $V_{DDX}$, a second power supply terminal connected to terminal 202 for receiving ground voltage $V_{SS}$, and several outputs for providing different power supply voltages used in MCU 200. These outputs include a power supply voltage labeled "$V_{DDH}$", a power supply voltage labelled "$V_{DDH\_LD}$", a power supply voltage labeled "$V_{DDH\_FLASH}$", a power supply voltage labeled "$V_{DDD}$", an analog ground voltage labeled "$V_{SSA}$", and a digital ground voltage labelled "$V_{SSD}$". The relevance of these voltages to the operation of negative voltage detector circuit 210 will be described more fully below.

In general, negative voltage detector circuit 210 detects a mode selection when a voltage on terminal 203 is driven to a negative or "below ground" voltage (e.g., below $V_{SSA}$) by more than a predetermined amount. The voltage on terminal 204 is used to enable the generation of the TEST MODE ENABLE signal, which negative voltage detector circuit 210 provides if the voltage on terminal 203 falls below ground by mode than the predetermined amount. Thus, the user can invoke a new test mode using only existing integrated circuit pins, greatly reducing the incremental product cost of adding the mode. No additional integrated circuit pins are needed because they can also be used for general-purpose I/O functions. In the example of MCU 200, the new mode is a new test mode. However, in other embodiments the user may select other modes. For example, when negative voltage detector circuit 210 detects a negative voltage, it may provide an enable signal to FLASH memory 114 or any other kind of non-volatile memory to enable a write operation. In this case, the output of negative voltage detector circuit 210 will be provided as a WRITE ENABLE signal to an input of FLASH memory 114. In other examples, negative voltage detector circuit 210 can enable a new debug or diagnostic mode, a low-power mode, a software bootstrap mode, an interrupt, and the like.

Figure 3:
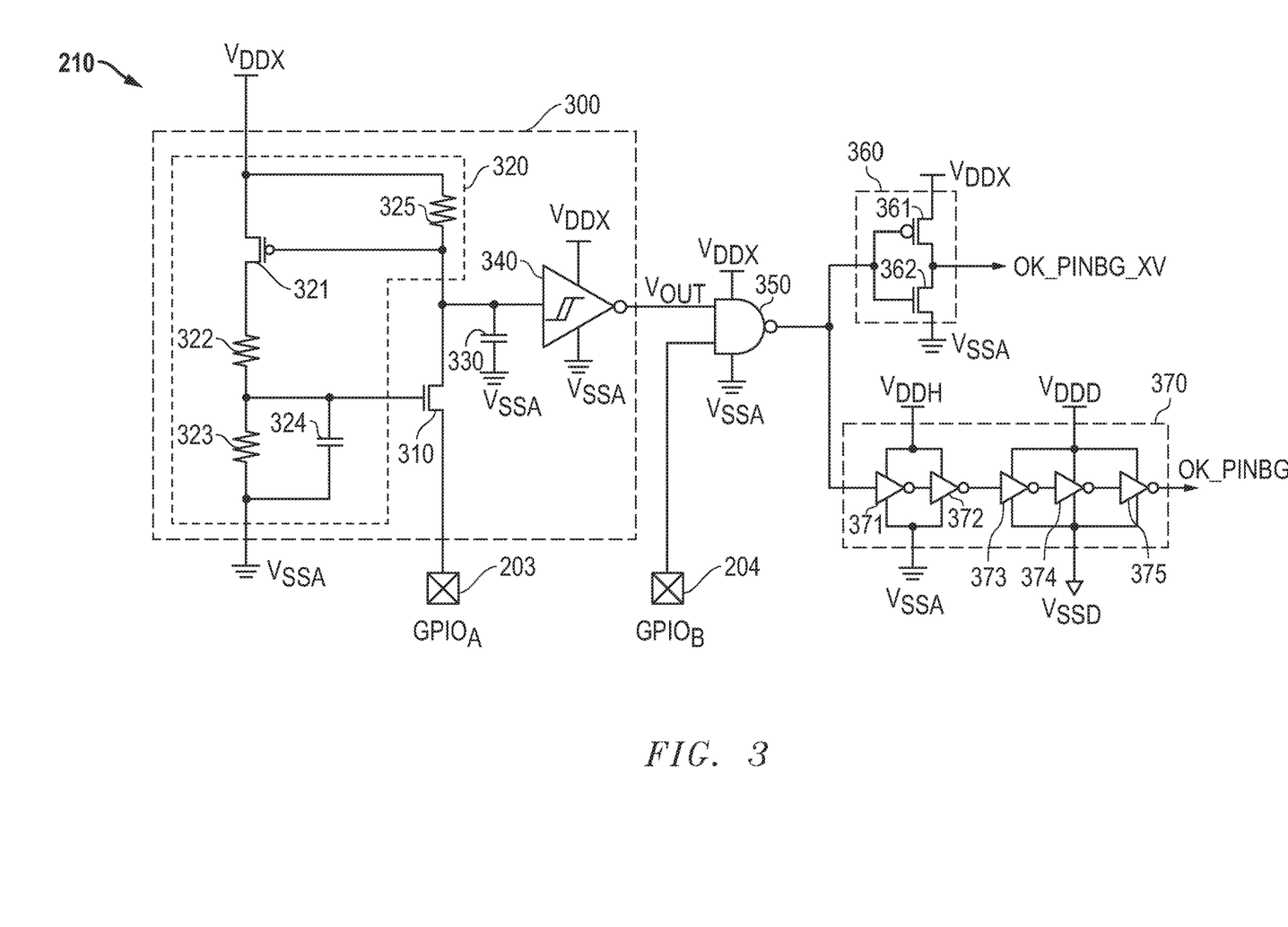
FIG. 3 illustrates in partial block diagram and partial schematic form the negative voltage detector circuit of FIG. 2.

FIG. 3 illustrates in partial block diagram and partial schematic form negative voltage detector circuit 210 of FIG. 2. Negative voltage detector circuit 210 includes generally a below-ground detector circuit 300, a NAND gate 350, an output circuit 360, and an output circuit 370.

Below-ground detector circuit 300 includes a transistor 310, a bias circuit 320, a capacitor 330, and an inverting buffer 340. Transistor 310 is an N-channel metal-oxide-semiconductor (MOS) transistor having a drain, a gate, and a source connected to terminal 203. Bias circuit 320 includes a transistor 321, resistors 322 and 323, a capacitor 324, and a resistor 325. Transistor 321 is a P-channel MOS transistor having a source connected to $V_{DDX}$, a gate connected to the drain of transistor 310, and a drain. Resistor 322 has a first terminal connected to the drain of transistor 321, and a second terminal connected to the gate of transistor 310. Resistor 323 has a first terminal connected to the second terminal of resistor 322, and a second terminal connected to $V_{SSA}$. Capacitor 324 has a first terminal connected to the second terminal of resistor 322, and a second terminal connected to $V_{SSA}$. Resistor 325 has a first terminal connected to $V_{DDX}$, and a second terminal connected to the gate of transistor 321 and to the source of transistor 310.

Capacitor 330 has a first terminal connected to the second terminal of resistor 325, and a second terminal connected to $V_{SSA}$.

Inverting buffer 340 has a power supply voltage terminal connected to $V_{DDX}$, a ground terminal connected to $V_{SSA}$, an input connected to the second terminal of resistor 325, and an output terminal for providing a signal labeled "$V_{OUT}$". Inverting buffer 340 also has built-in hysteresis.

NAND gate 350 has a power supply voltage terminal connected to $V_{DDX}$, a ground terminal connected to $V_{SSA}$, a first input connected to the output of inverting buffer 340, a second input connected to terminal 204, and an output.

Output circuit 360 has an input connected to the output of NAND gate 350, and an output for providing a signal labelled "OK_PINBG_XV". Output circuit 360 includes transistors 361 and 362. Transistor 361 is a P-channel MOS transistor having a source connected to $V_{DDX}$, a gate connected to the output of NAND gate 350, and a drain for providing the OK_PINBG_XV signal. Transistor 362 is an N-channel transistor having a drain connected to the drain of transistor 361, a gate connected to the output of NAND gate 350, and a source connected to $V_{SSA}$.

Output circuit 370 has an input connected to the output of NAND gate 350, and an output for providing a signal labelled "OK_PINBG". Output circuit 370 includes inverters 371, 372, 373, 374, and 375. Inverter 371 has an input connected to the output of NAND gate 350, and an output. Inverter 372 has an input connected to the output of inverter 371, and an output. Inverters 371 and 372 are in the $V_{DDH}$ voltage domain and each has a first power supply terminal connected to $V_{DDH}$, and a second power supply terminal connected to $V_{SSA}$. Inverter 373 has an input connected to the output of inverter 372, and an output. Inverter 374 has an input connected to the output of inverter 373, and an output. Inverter 375 has an input connected to the output of inverter 374, and an output. Inverters 373, 374, and 375 are in the $V_{DDD}$ voltage domain and each has a first power supply terminal connected to $V_{DDD}$, and a second power supply terminal connected to $V_{SSD}$.

Negative voltage detector circuit 210 operates as follows. Below-ground detector circuit 300 detects when the voltage on terminal 203 is below ground. Resistors 322 and 323 form a voltage divider that develops a voltage on the common terminal thereof that is a fraction of $V_{DDX}$. The common terminal is $V_{SSA}$ such that the gate voltage of transistor 310 is $V_{SSA}$ when terminal 203 is at ground or above ground. Under this condition, the gate-to-source voltage of transistor 310 is less than the threshold voltage of transistor 310. Thus transistors 310 and 321 are non-conductive. When terminal 203 falls to a negative voltage far enough below ground that the gate-to-source voltage of transistor 310 is greater than the threshold voltage of transistor 310, transistors 310 and 321 become conductive. When transistor 310 is conductive, it discharges capacitor 330, causing inverting buffer 240 to output $V_{OUT}$ at a logic high voltage. The voltage difference on the common terminal, between when transistors 310 and 321 are non-conductive and when transistors 310 and 321 are conductive, is the hysteresis voltage that is a fraction of $V_{DDX}$. For example, if the minimum threshold voltage of transistor 310 is 0.4 volts for the manufacturing process technology used, then transistors 310 and 321 become conductive when the voltage on terminal 203 falls to −0.4 volts or less. Resistors 322 and 323 may be sized to place a voltage of 0.2 volts on the gate of transistor 310 when transistor 321 is conductive. Thus, the voltage on terminal 203 must rise above about −0.2 volts to make transistor 310 non-conductive and the hysteresis is 0.2 volts. Thus, below-ground detector circuit 300 provides hysteresis to make it more robust.

Bias circuit 320 is designed to consume zero static power during normal operation when the voltage on terminal 203 is at $V_{SSA}$, while setting a threshold at which it stops detecting the negative voltage and defining the size of the hysteresis. On power up, the voltage on the first terminal of capacitor 330 is initially low, making transistor 321 conductive and to set the bias point of transistor 310 using resistors 322 and 323. As capacitor 330 charges, eventually transistor 321 becomes non-conductive, preventing the flow of static current through resistors 322 and 323. Capacitors 324 and 330 and resistors 322, 323, and 325 are sized relative to each other so that transistor 324 charges before capacitor 330 does.

NAND gate 350 operates as an enable circuit. When the voltage on terminal 204 provided to the second input of NAND gate 350 is a logic low, then the output of NAND gate 350 is a logic high regardless of the state of $V_{OUT}$. The logic high at the output of NAND gate 350 causes OK_PINBG_XV and OK_PINBG to be at logic low levels, because each respective signal path having an odd number of inversions. Thus, when the voltage on terminal 204 is a logic low, the user cannot invoke a test mode regardless of the voltage on terminal 203.

When the voltage on terminal 204 provided to the second input of NAND gate 350 is a logic high, then the output of NAND gate 350 is determined by the logic state of $V_{OUT}$, in which a logic high on $V_{OUT}$ indicates that terminal 203 was detected to be below ground, and a logic high on $V_{OUT}$ indicates that terminal 203 was not detected to be below ground. A logic high at the output of NAND gate 350 causes OK_PINBG_XV and ON_PINBG to be a logic low, each respective signal path having an odd number of inversions. Thus when the voltage on terminal 204 is a logic high, the states of OK_PINBG_XV and OK_PINBG reflect whether the voltage on terminal 203 is below ground.

Output circuit 360 provides below ground detector signal OK_PINBG_XV to indicate that terminal 203 was detected to be below ground when enabled. OK_PINBG_XV is referenced to the $V_{DDX}$ voltage domain. Since all previous circuitry is in the $V_{DDX}$ voltage domain, a single inversion is sufficient.

Output circuit 370 provides below ground detector signal OK_PINBG to indicate that terminal 203 was detected to be below ground when enabled, and is referenced to the $V_{DDD}$ voltage domain. Thus, output circuit 370 provides a level shifting function between the $V_{DDX}$ domain and the $V_{DDD}$ domain.

Collectively, signals OK_PINBG_XV and OK_PINBG form the TEST MODE ENABLE signal shown in FIG. 2, and negative voltage detector circuit 210 is used to recognize a user-invoked test mode.

Figure 4:
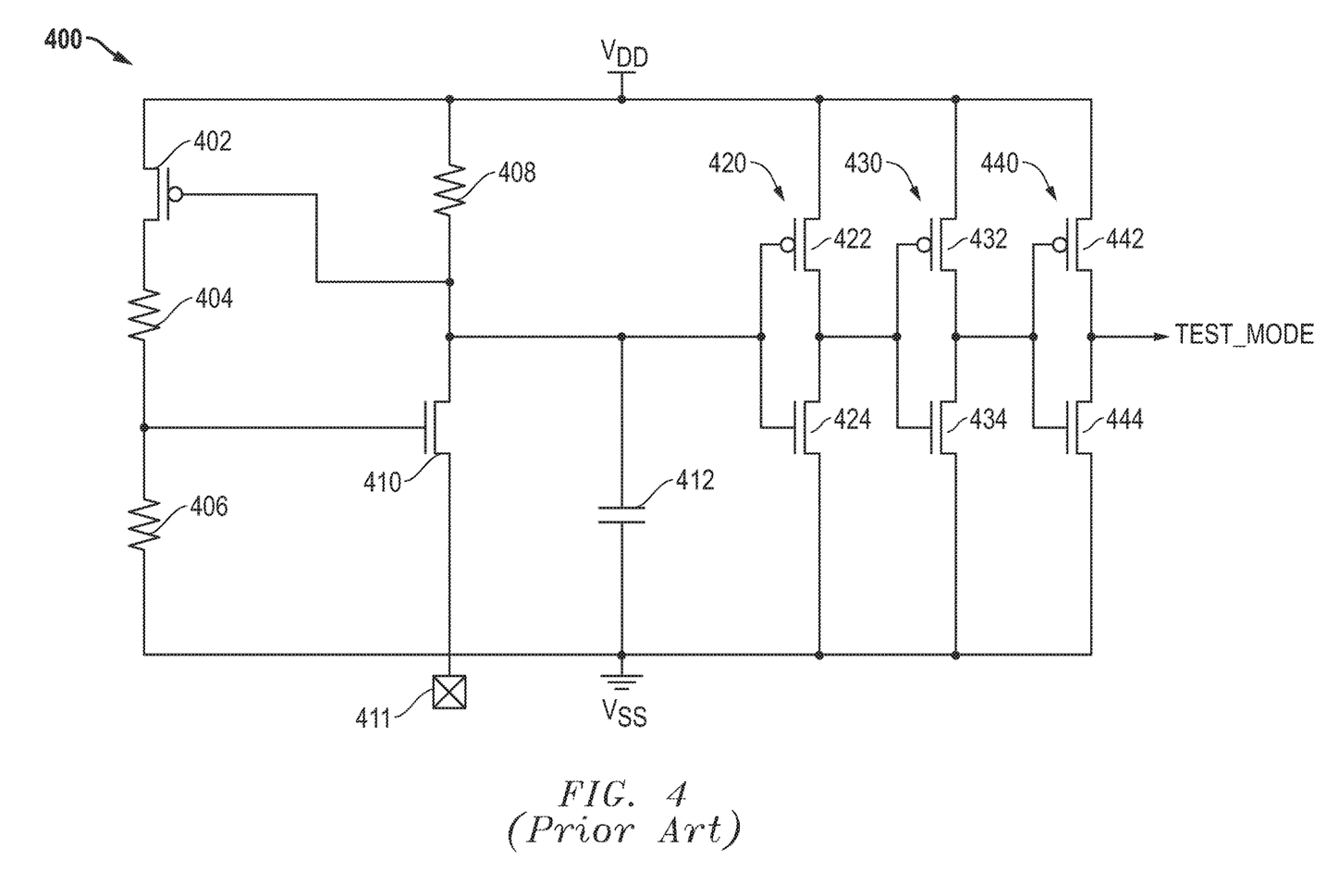
FIG. 4 illustrates in schematic form a negative voltage detector circuit known in the prior art.

Negative voltage detector circuit 210 has several advantages, which can be understood with reference to FIG. 4, which illustrates in schematic form a negative voltage detector circuit 400 known in the prior art. Negative voltage detector circuit 400 includes a transistor 402, resistors 404, 406, and 408, a transistor 410, a capacitor 412, and inverters 420, 430, and 440. Transistor 402 is a P-channel MOS transistor having a source connected to a power supply voltage terminal labeled "$V_{DD}$", a gate, and a drain. Resistor 404 has a first terminal connected to the drain of transistor 402, and a second terminal. Resistor 406 has a first terminal connected to the drain of transistor 402, and a second terminal connected to a power supply voltage terminal labeled "$V_{SS}$". Resistor 408 has a first terminal connected to $V_{DD}$, and a second terminal connected to the gate of transistor 402. Transistor 410 is an N-channel MOS transistor having a drain connected to the second terminal of resistor 408, a gate connected to the second terminal of resistor 404, and a source connected to an integrated circuit terminal 411. Capacitor 412 has a first terminal connected to the second terminal of resistor 408 and to the drain of transistor 410, and a second terminal connected to $V_{SS}$.

Inverter 420 includes transistors 422 and 424. Transistor 422 is a P-channel MOS transistor having a source connected to $V_{DD}$, a gate connected to the second terminal of resistor 408 and to the drain of transistor 410, and a drain. Transistor 424 is an N-channel MOS transistor having a drain connected the drain of transistor 422, a gate connected to the second terminal of resistor 408 and to the drain of transistor 410, and a drain connected to $V_{SS}$.

Inverter 430 includes transistors 432 and 434. Transistor 432 is a P-channel MOS transistor having a source connected to $V_{DD}$, a gate connected to the drains of transistors 422 and 424, and a drain. Transistor 434 is an N-channel MOS transistor having a drain connected the drain of transistor 432, a gate connected to the drains of transistors 432 and 434, and a drain connected to $V_{SS}$.

Inverter 440 includes transistors 442 and 444. Transistor 442 is a P-channel MOS transistor having a source connected to $V_{DD}$, a gate connected to the drains of transistors 432 and 434, and a drain for providing an output signal labeled "TEST MODE". Transistor 444 is an N-channel MOS transistor having a drain connected the drain of transistor 442, a gate connected to the drains of transistors 432 and 434, and a drain connected to $V_{SS}$.

Negative voltage detector circuit 400 detects when the voltage on integrated circuit terminal 411 drops below $V_{SS}$ by an amount sufficient to turn transistor 410 on. Like negative voltage detector circuit 210, when transistor 410 becomes conductive, it discharges the voltage on capacitor 412, causing the TEST MODE signal to be activated at a logic high. However negative voltage detector circuit 210 improves the performance of negative voltage detector circuit 400 in two ways. First, negative voltage detector circuit 210 includes circuit enhancements to prevent false triggering. The enhancements include adding an enable function by adding NAND gate 350 that keeps the below-ground signals from triggering except when a logic high voltage is input to terminal 204; adding capacitor 324 to filter noise (e.g. ground bounce) on the $V_{SSA}$ terminal to prevent the voltage on the gate of transistor 310 from accidentally biasing transistor 310 to be conductive; and adding a hysteretic buffer 340 to increase the threshold after capacitor 340 has been discharged. These enhancements allow negative voltage detector circuit 210 to be especially useful in low-voltage CMOS integrated circuits that may otherwise be susceptible to false triggering due to the lowered transistor threshold voltages.

Second, negative voltage detector circuit 210 provides output paths that output the enable signal (below-ground condition detected) for two voltage domains. This feature allows negative voltage detection circuit to control the modes of both digital circuits on the $V_{DDD}$ domain and analog or I/O circuits on the $V_{DDX}$ domain. This enhancement allows negative voltage detector circuit 210 to be useful in complex CMOS integrated circuits that have circuits operating on multiple voltage domains.

The above-disclosed subject matter is to be considered illustrative, and not restrictive, and the appended claims are intended to cover all such modifications, enhancements, and other embodiments that fall within the true scope of the claims. For example, various mode selection actions may be taken by a logic circuit that is responsive to the negative voltage detection, including the invocation of a test mode as in the embodiment described above. More than one output circuit referenced to particular voltage domains may not be needed, depending on the mode selected. FIG. 3 showed an example in which circuitry referenced to the $V_{DDX}$ and $V_{DDD}$ domains each receive a respective mode selection indicator. While MOS transistors provide a low-cost technology that consumes very little static power, other transistor technologies may be used instead. Also, a negative voltage detector circuit as disclosed herein can be used on other types of integrated circuits besides MCUs, including microprocessors, application specific integrated circuits (ASICs), gate arrays, memories, mixed signal processing chips, and the like.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit, comprising:
a negative voltage detector circuit having a power supply input coupled to a power supply voltage terminal, a ground input coupled to a ground voltage terminal, a first input coupled to a first signal terminal, a second input coupled to a second signal terminal, and an output for providing an enable signal when a voltage on said first signal terminal is less than a voltage on said ground voltage terminal by at least a predetermined amount when a signal on said second signal terminal is in a first predetermined logic state, said negative voltage detector circuit comprising a below-ground detector circuit having an output for providing an output voltage, and a first output circuit for providing a first logic signal in response to said output voltage being in said first logic state, said below-ground detector circuit comprising:
a transistor having a first current electrode, a control electrode, and a second current electrode coupled to said first signal terminal;
a bias circuit for biasing said first current electrode and said control electrode of said transistor such that said transistor remains non-conductive during power supply transients, and becomes conductive after said power supply transients when a voltage on said first signal terminal is less than a voltage on said ground voltage terminal by at least said predetermined amount;
an output capacitor having a first terminal coupled to said first current electrode of said transistor, and a second terminal coupled to said ground voltage terminal; and
an inverting buffer having an input coupled to said first current electrode of said transistor, and an output terminal for providing said output voltage; and
a logic circuit having an input for receiving said enable signal, said logic circuit changing an operation of the integrated circuit in response to an activation of said enable signal.

2. The integrated circuit of claim 1, wherein:
said first output circuit further provides said first logic signal in an active state referenced to a first voltage domain in response to said output voltage being in said first logic state; and
said negative voltage detector circuit further comprises a second output circuit for providing a second logic signal in an active state referenced to a second voltage domain in response to said output voltage being in said first logic state.

3. The integrated circuit of claim 1, wherein said bias circuit comprises:
a transistor having a first current electrode coupled to said power supply voltage terminal, a control electrode coupled to said first terminal of said output capacitor, and a second current electrode;
a first resistor having a first terminal coupled to said second current electrode of said transistor, and a second terminal;
a second resistor having a first terminal coupled to said second terminal of said first resistor, and a second terminal coupled to said ground voltage terminal;
a capacitor having a first terminal coupled to said second terminal of said first resistor, and a second terminal coupled to said ground voltage terminal; and
a third resistor having a first terminal coupled to said power supply voltage terminal, and a second terminal coupled to said control electrode of said transistor.

4. The integrated circuit of claim 1, wherein the integrated circuit is a microcontroller comprising:
a central processing unit (CPU) core coupled to a CPU bus;
a bus bridge having a first port coupled to said CPU bus, and a second port coupled to a peripheral bus; and
an input/output port circuit coupled to said peripheral bus and to said first signal terminal and to said second signal terminal.

5. The integrated circuit of claim 4, wherein said logic circuit comprises:
a test mode controller coupled to said negative voltage detector circuit and having an input for receiving said enable signal, said test mode controller changing an operation of said microcontroller in response to an activation of said enable signal.

6. The integrated circuit of claim 4, wherein said logic circuit comprises:
a non-volatile memory coupled to said negative voltage detector circuit and having an input for receiving said enable signal, said non-volatile memory is enabled for a write operation in response to an activation of said enable signal.

7. A circuit, comprising:
a below-ground detector circuit having an input coupled to a first signal terminal, and an output for providing an output voltage in a first logic state when a voltage on said first signal terminal is less than a voltage on said ground voltage terminal by at least a predetermined amount, wherein said below-ground detector circuit comprises:
a transistor having a first current electrode, a control electrode, and a second current electrode coupled to said first signal terminal;
a bias circuit for biasing said first current electrode and said control electrode of said transistor such that said transistor remains non-conductive during power supply transients, and becomes conductive after said power supply transients when a voltage on said first signal terminal is less than a voltage on said ground voltage terminal by at least said predetermined amount;
an output capacitor having a first terminal coupled to said first current electrode of said transistor, and a second terminal coupled to said ground voltage terminal; and
an inverting buffer having an input coupled to said first current electrode of said transistor, and an output terminal for providing said output voltage;
a first output circuit for providing a first logic signal in an active state of referenced to a first voltage domain in response to said output voltage being in said first logic state; and
an enable circuit coupled to a second signal terminal for disabling said first output circuit when said second signal terminal is in a second logic state.

8. The circuit of claim 7, further comprising:
a second output circuit for providing a second below-ground logic signal in an active state referenced to a second voltage domain in response to said output voltage being in said first logic state,
wherein said enable circuit further disables said second output circuit when said second signal terminal is in said second logic state.

9. The circuit of claim 7, wherein said transistor of said below-ground detector circuit comprises an N-channel metal-oxide-semiconductor (MOS) transistor.

10. The circuit of claim 7, wherein said inverting buffer has an associated hysteresis.

11. The circuit of claim 7 wherein said bias circuit comprises:
a transistor having a first current electrode coupled to a power supply voltage terminal, a control electrode coupled to said first terminal of said output capacitor, and a second current electrode;
a first resistor having a first terminal coupled to said second current electrode of said transistor, and a second terminal;
a second resistor having a first terminal coupled to said second terminal of said first resistor, and a second terminal coupled to said ground voltage terminal;
a capacitor having a first terminal coupled to said second terminal of said first resistor, and a second terminal coupled to said ground voltage terminal; and
a third resistor having a first terminal coupled to said power supply voltage terminal, and a second terminal coupled to said control electrode of said transistor.

12. The circuit of claim 7, wherein said transistor of said below-ground detector circuit comprises a P-channel metal-oxide-semiconductor (MOS) transistor.

13. A method of operating an integrated circuit, comprising:
detecting whether a voltage on a first input/output port terminal of the integrated circuit is less than a voltage on a ground voltage terminal by at least a predetermined amount, wherein said detecting comprises:
biasing a first current electrode and a control electrode of a transistor such that said transistor remains non-conductive during power supply transients, and becomes conductive after said power supply transients when a voltage on said first input/output port terminal is less than a voltage on said ground voltage terminal by at least said predetermined amount;
filtering a voltage at said first current electrode of said transistor using an output capacitor;

buffering said voltage at said first current electrode of said transistor; and providing a first logic signal in response to said buffering, and enabling said detecting in response to a logic state of a second input/output port terminal;

activating said first logic signal referenced to a first voltage domain; and changing an operation of a first circuit of the integrated circuit in response to an activation said first logic signal.

14. The method of claim 13, wherein said changing said operation of said first circuit of the integrated circuit in response to said activating of said first logic signal comprises:

operating a central processing unit (CPU) core in a test mode in response to said activating of said first logic signal.

15. The method of claim 14, further comprising:

activating a second logic signal referenced to a second voltage domain in response to detecting that said voltage on said first input/output port terminal of the integrated circuit is less than a voltage on said ground voltage terminal by at least a predetermined amount; and changing an operation of a second circuit of the integrated circuit in response to an activation said second logic signal.

16. An integrated circuit comprising a below-ground detector circuit, said below-ground detector circuit comprising:

a transistor having a first current electrode, a control electrode, and a second current electrode coupled to a first signal terminal of the integrated circuit;

a bias circuit for biasing said first current electrode and said control electrode of said transistor such that said transistor remains non-conductive during power supply transients, and becomes conductive after said power supply transients when a voltage on said first signal terminal is less than a voltage on said ground voltage terminal by at least a predetermined amount;

an output capacitor having a first terminal coupled to said first current electrode of said transistor, and a second terminal coupled to a ground voltage terminal; and an inverting buffer having an input coupled to said first current electrode of said transistor, and an output terminal for providing an output voltage.

17. The integrated circuit of claim 16, wherein said bias circuit comprises:

a transistor having a first current electrode coupled to a power supply voltage terminal, a control electrode coupled to said first terminal of said output capacitor, and a second current electrode;

a first resistor having a first terminal coupled to said second current electrode of said transistor, and a second terminal;

a second resistor having a first terminal coupled to said second terminal of said first resistor, and a second terminal coupled to said ground voltage terminal;

a capacitor having a first terminal coupled to said second terminal of said first resistor, and a second terminal coupled to said ground voltage terminal; and a third resistor having a first terminal coupled to said power supply voltage terminal, and a second terminal coupled to said control electrode of said transistor.

18. The integrated circuit of claim 16, further comprising:
a first output circuit for providing a first logic signal in an active state in response to said output voltage being in a first logic state.

19. The integrated circuit of claim 18, further comprising:
a non-volatile memory coupled to said first output circuit and having an input for receiving said first logic signal, wherein said non-volatile memory is enabled for a write operation in response to an activation of said first logic signal.

20. The integrated circuit of claim 18, further comprising:
an enable circuit coupled to a second signal terminal of the integrated circuit for disabling said first output circuit when said second signal terminal is in a second logic state.

21. The integrated circuit of claim 20, wherein the integrated circuit is a microcontroller comprising:

a central processing unit (CPU) core coupled to a CPU bus;

a bus bridge having a first port coupled to said CPU bus, and a second port coupled to a peripheral bus; and an input/output port circuit coupled to said peripheral bus and to said first signal terminal and to said second signal terminal.

22. The integrated circuit of claim 21, further comprising:
a test mode controller coupled to said below-ground detector circuit and having an input for receiving said first logic signal, said test mode controller changing an operation of said microcontroller in response to an activation of said first logic signal.

\* \* \* \* \*